(12) United States Patent
Inui et al.

(10) Patent No.: US 7,254,371 B2
(45) Date of Patent: Aug. 7, 2007

(54) MULTI-PORT MULTI-BAND RF SWITCH

(75) Inventors: Shinsuke Inui, Yamato (JP); Ikuroh Ichitsubo, Sagamihara (JP)

(73) Assignee: Micro-Mobio, Inc., Palo Alto, CA (US)

( * ) Notice: Subject to any disclaimer, the term of this patent is extended or adjusted under 35 U.S.C. 154(b) by 384 days.

(21) Appl. No.: 10/919,850

(22) Filed: Aug. 16, 2004

(65) Prior Publication Data
US 2006/0035614 A1 Feb. 16, 2006

(51) Int. Cl.
*H04B 1/38* (2006.01)
*H04B 1/40* (2006.01)

(52) U.S. Cl. ............................ 455/78; 455/73; 455/83

(58) Field of Classification Search .................. 455/78, 455/327, 333, 73, 83, 552.1, 325; 333/103, 333/262, 101
See application file for complete search history.

(56) References Cited

U.S. PATENT DOCUMENTS

| | | | |
|---|---|---|---|
| 4,977,041 A | 12/1990 | Shiozawa | |
| 5,050,238 A | 9/1991 | Tomizuka | |
| 5,164,683 A | 11/1992 | Shields | |
| 5,255,324 A | 10/1993 | Brewer | |
| 5,283,539 A | 2/1994 | Sadhir | |
| 5,548,239 A * | 8/1996 | Kohama | 327/408 |
| 5,608,364 A | 3/1997 | Hirai | |
| 5,625,894 A * | 4/1997 | Jou | 455/78 |
| 5,656,972 A | 8/1997 | Norimatsu | |
| 5,697,087 A | 12/1997 | Miya | |
| 5,732,334 A | 3/1998 | Miyake | |
| 5,774,792 A | 6/1998 | Tanaka et al. | |
| 5,825,227 A * | 10/1998 | Kohama et al. | 327/308 |
| 5,880,635 A | 3/1999 | Satoh | |
| 5,969,560 A * | 10/1999 | Kohama et al. | 327/308 |
| 6,025,651 A | 2/2000 | Nam | |
| 6,075,995 A | 6/2000 | Jensen | |
| 6,118,985 A * | 9/2000 | Kawakyu et al. | 455/78 |
| 6,148,220 A | 11/2000 | Sharp | |
| 6,151,509 A | 11/2000 | Chorey | |
| 6,175,279 B1 | 1/2001 | Ciccarelli | |
| 6,183,703 B1 | 2/2001 | Hsu | |
| 6,198,351 B1 | 3/2001 | Winslow | |
| 6,203,587 B1 | 3/2001 | Lesieur | |
| 6,262,630 B1 | 7/2001 | Eriksson | |
| 6,265,943 B1 | 7/2001 | Dening | |
| 6,265,954 B1 | 7/2001 | Krause | |
| 6,281,755 B1 | 8/2001 | Feld | |
| 6,281,762 B1 * | 8/2001 | Nakao et al. | 333/103 |
| 6,294,967 B1 | 9/2001 | Hirai | |
| 6,326,866 B1 | 12/2001 | Sasaki | |
| 6,366,788 B1 | 4/2002 | Fujioka | |

(Continued)

OTHER PUBLICATIONS

U.S. Appl. No. 11/126,667, filed May 11, 2005, Ikuroh Ichitsubo.

(Continued)

*Primary Examiner*—Sonny Trinh
(74) *Attorney, Agent, or Firm*—Tran & Associates

(57) ABSTRACT

Systems and methods are disclosed for sharing a network with two switching devices forming a single pole double throw (SPDT) switch. Two SPDT switches can also be used in a double pole double throw (DPDT) configuration that shares a network, thus reducing component count and die size.

13 Claims, 6 Drawing Sheets

U.S. PATENT DOCUMENTS

| | | |
|---|---|---|
| 6,417,730 B1 | 7/2002 | Segallis |
| 6,496,684 B2 * | 12/2002 | Nakao et al. .................. 455/78 |
| 6,693,498 B1 * | 2/2004 | Sasabata et al. ............ 333/103 |
| 6,720,850 B2 * | 4/2004 | Sasabata et al. ............ 333/261 |
| 2004/0203552 A1 | 10/2004 | Horiuchi et al. |
| 2004/0204037 A1 * | 10/2004 | He et al. .................. 455/553.1 |
| 2005/0179498 A1 | 8/2005 | Tsutsui et al. |
| 2005/0239415 A1 * | 10/2005 | Sagae et al. .................. 455/78 |
| 2006/0164188 A1 | 7/2006 | Yamada |

OTHER PUBLICATIONS

U.S. Appl. No. 11/152,308, filed Jun. 14, 2005, Ikuroh Ichitsubo.
U.S. Appl. No. 11/173,741, filed Jul. 2, 2005, Ikuroh Ichitsubo.
U.S. Appl. No. 11/173,965, filed Jul. 2, 2005, Ikuroh Ichitsubo.
U.S. Appl. No. 11/173,968, filed Jul. 2, 2005, Ikuroh Ichitsubo.
U.S. Appl. No. 11/323,763, filed Dec. 30, 2005, Ikuroh Ichitsubo.
U.S. Appl. No. 11/323,788, filed Dec. 30, 2005, Ikuroh Ichitsubo.
U.S. Appl. No. 11/433,896, filed May 12, 2006, Ikuroh Ichitsubo.
U.S. Appl. No. 11/486,465, filed Jul. 14, 2006, Ikuroh Ichitsubo.

* cited by examiner

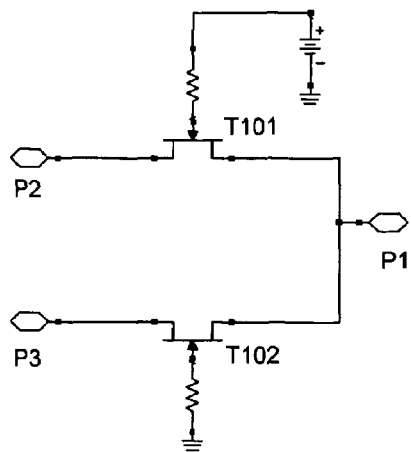
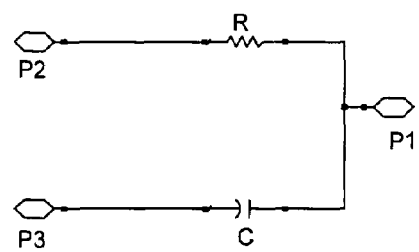
Fig. 1A (PRIOR ART)
Fig. 1B (PRIOR ART)
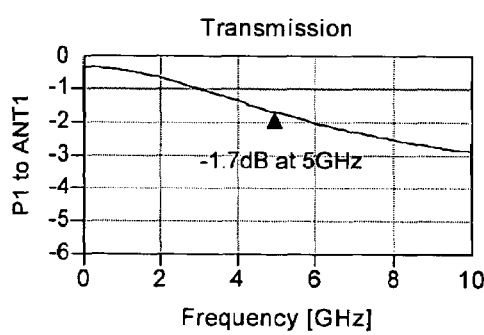
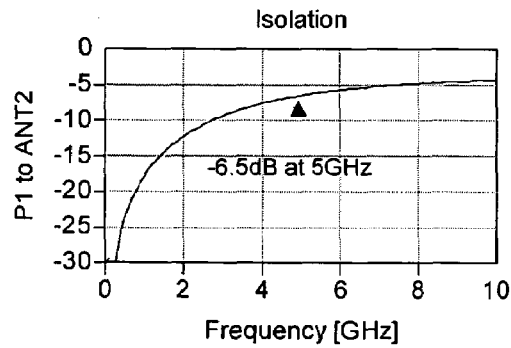
Fig. 1C (PRIOR ART)
Fig. 1D (PRIOR ART)

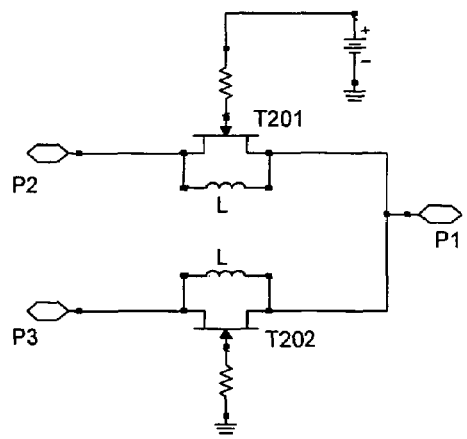
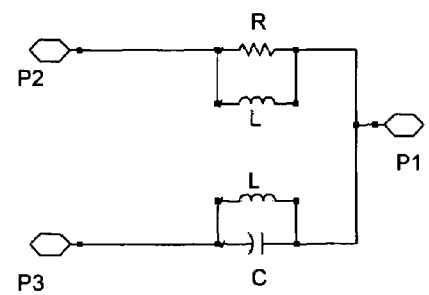
Fig. 2A (PRIOR ART)
Fig. 2B (PRIOR ART)
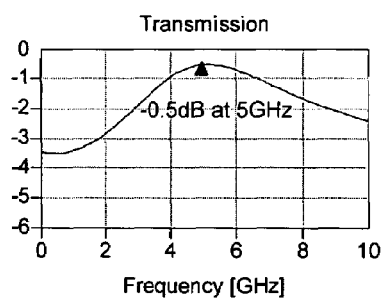
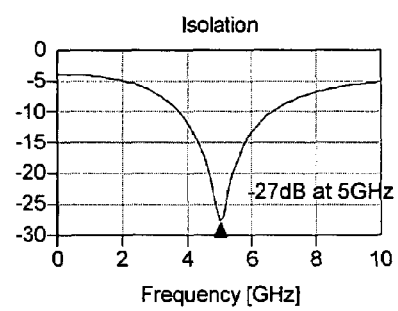
Fig. 2C (PRIOR ART)
Fig. 2D (PRIOR ART)

MULTI-PORT MULTI-BAND RF SWITCH

BACKGROUND

Radio frequency (RF) signals often must be switched between two destinations, such as when switching an RF signal between a first antenna and a second antenna. Switches that support this configuration are classified as single pole, double throw (SPDT) switches.

SPDT switches known in the art are either solid-state devices or mechanical relays. Mechanical switches are generally quite large, compared to other RF components, and consume significant amounts of power. In communications applications, switches are often designed with semiconductor elements such as transistors or pin diodes. However, for high frequency RF signals in the gigahertz range and above, these devices could suffer from several shortcomings. For example, the device has high insertion loss, which is the loss across the switch when the switch is closed. On the other hand, the device has low isolation, which means signal 'leakage' across the switch when the switch is open. In addition, the insertion losses and isolation values for these switches varies depending on the frequency of the signal passing through the switches, which cause unevenness in frequency response and is unsuitable for broadband wireless communications. Isolation between the two output ports of the SPDT switch is of another concern, since coupling of the signal from one output port to the other output port limits the effectiveness of the switch as a dual output port device. Without proper circuitry to overcome the above-mentioned characteristics, semiconductor transistors and pin diodes would not function properly as switches in microwave applications.

FIG. 1A shows a basic prior art SPDT circuit, while FIG. 2A shows an improved prior art SPDT circuit with a parallel inductor. In FIG. 1A, a first switching device T101 such as a FET or PHEMT (Pseudomorphic High Electron Mobility Transistor) is positioned between the first port P1 and the second port P2. Correspondingly, a second switching device T102 is positioned between the second port P2 and the third port P3.

A simplified equivalent circuit with transistor off can be represented by a parasitic capacitor between the drain terminal and the source terminal. The insertion loss of the SPDT switch is determined by the resistance value between drain and source of each transistor. As shown in FIG. 1B, when a semiconductor switching device is turned on, the device can be modeled with a resistor R. When a switching device is turned off, the device can be modeled with a capacitor C. Thus, when the first switching device is turned on and the second switching device is turned off, an equivalent circuit between P2 port and P3 port can be modeled as a resistance in series with a capacitance, with P1 port at the junction between the resistance and capacitance. The resistance results in loss of signal strength, which is commonly known as insertion loss. In addition, the signal can leak through the capacitance of the "off state" switching device, especially at high frequency. For instance, as shown in FIGS. 1C and 1D, using R=4 ohms and C=0.4 pF, there is a −1.7 dB insertion loss in transmission at 5 GHz between P1 and P2 and −6.5 dB of isolation at 5 GHz between P1 and P3.

To reduce the insertion loss, inductors can be added in parallel to the switching devices. The inductance and the capacitance of the switching device becomes a LC resonator with high impedance at the resonating frequency. For example, two inductors L are added in parallel to the source and the drain ends or terminals of the switching device T201 and T202 of FIG. 2A. When the first switching device T201 is turned on and the second switching device T202 is turned off, the circuit of FIG. 2A can be modeled by an equivalent circuit as a resistor R in a parallel with the inductor L and a capacitor C in parallel with inductor L, as shown in FIG. 2B. Assuming that L=2.5 nH, the insertion loss in transmission between P1 and P2 has been improved to −0.5 dB at 5 GHz, as shown in FIG. 2C. Moreover, the isolation between P1 and P3 has been improved to −27 dB at 5 GHz as shown in FIG. 2D.

U.S. Pat. No. 5,774,792 uses such an approach where an SPDT switch includes a plurality of FETs, the FET on the receiver side through which a received signal passes and the shunt FET on the transmitter side are each formed of series-connected FETs, and a capacitor is connected between the first gate and the source and between the second gate and the drain. An inductance is connected in parallel with a series connection of FETs. Similarly, U.S. Pat. No. 6,693,498 uses a plurality of FETs in the SPDT switch and a first inductor connected in parallel to the first FET, and a second inductor connected in parallel to the second FET. The SPDT switch may further include a first inductor connected in series to the first FET, a first capacitor connected in parallel to the series connection of the first FET and the first inductor, a second inductor connected in series to the second FET, and a second capacitor connected in parallel to the series connection of the second FET and the second inductor.

In integrated circuits, size and space constraints are of primary importance. One problem with adding multiple inductors or other passive RF components to microcircuits is that the increase of the die size and thus increasing the cost of a switch.

SUMMARY

Systems and methods are disclosed for sharing a network with two switching devices forming a single pole double throw (SPDT) switch. Two SPDT switches can also be used in a double pole double throw (DPDT) configuration that shares a network, thus reducing component count and die size.

In a first aspect, a multi-port circuit to switch radio frequency (RF) signals among one or more RF signal paths includes a first RF switching device; a second RF switching device coupled to the first RF switching device; a third RF switching device coupled to the second RF switching device; a fourth RF switching device coupled to the third and first RF switching devices; and a shared circuit coupled to the first and third RF switching devices.

Implementations of the aspect may include one or more of the following. Each switching device can be a transistor. The shared circuit can be a frequency selecting circuit, a matching network, a resonator, a filter, a micro-strip, or a transmission line. The shared circuit can also be a resistor, a capacitor or an inductor.

In yet another aspect, an SPDT switch having first, second and third ports includes first and second switching devices each having first and second terminals, wherein the first terminals are coupled to the first port and the second terminals are coupled to the second and third ports respectively; and a shared network positioned between the second and third ports.

The shared network can be a frequency selecting circuit, a matching network, a resonator, a filter, a micro-strip, or a transmission line. The shared network can also be a resistor, a capacitor or an inductor. The ports can be connected to a transmitter, a receiver or an antenna.

In yet another aspect, a double pole double throw (DPDT) switch is constructed by using two SPDT switches. The DPDT switch has first, second, third and fourth ports and includes first and second switching devices each having first and second terminals, wherein the first terminals are coupled to the first port, and the second terminals are coupled to the second port and the third port, respectively; third and fourth switching devices each having third and fourth terminals, wherein the third terminals are coupled to the fourth port, and the fourth terminals are coupled to the second port and third port, respectively; and a shared network positioned between the second and third ports.

Advantages of the invention may include one or more of the following. The switch circuits provide low transmission loss, high isolation, miniaturization and low cost. The system provides higher performance and increased miniaturization for multi port, multi frequency switches. These features are ideal for RF applications that operate with multiple band communication systems such as GSM, DCS, CDMA, W-CDMA, Wireless LAN, among others.

Instead of multiple sets of passive component as required by the multiple switching transistors in a typical SPDT or DPDT switches, the entire SPDT or DPDT switch requires only one shared set of passive circuit to operate, even for multi frequency signals. Due to the reduced number of passive LC components employed in the invention, the entire switch circuitry can be fabricated to fit in a small substrate space with lower cost. Furthermore, the frequency selecting circuitry can include filter, impedance matching, and other RF frequency shaping function using inductor, capacitor and RF micro strip, transmission line, and etc. Thus, the shared frequency selecting circuit can also function as impedance match for the transmission path. Moreover, certain embodiments of the switch are capable of switching signals within multiple frequencies by changing the operating frequency of the frequency selecting circuit.

Consequently, the switch can be especially useful for microwave and millimeter wave signal switching applications. Additional advantages are that the switch exhibits low insertion loss and mismatch loss along the "ON" RF path, thus creating very little power loss over the bandwidths of interest. Also, the switch exhibits high RF isolation along the "OFF" RF path.

The single SPDT switch as well as the dual SPDT switch can be easily controlled and reduced in size and cost. Furthermore, a communication unit using such an SPDT or dual SPDT switch can also be reduced in size and cost.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. This invention is not limited to any specific semiconductor technology. For example, the invention can be implemented with various semiconductor materials such as PHEMT, MESFET, and CMOS, among others. Other features and advantages of the present invention will become apparent from the following description of the invention that refers to the accompanying drawings, in which like references denote like elements and parts.

BRIEF DESCRIPTION OF THE DRAWINGS

In order that the manner in which the above recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 1A-1D show a basic prior art SPDT circuit, an equivalent circuit, a simulated transmission characteristic plot and a simulated isolation characteristic plot, respectively.

FIGS. 2A-2D show an improved prior art SPDT circuit, an equivalent circuit, a simulated transmission characteristic plot and a simulated isolation characteristic plot, respectively.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 3A:
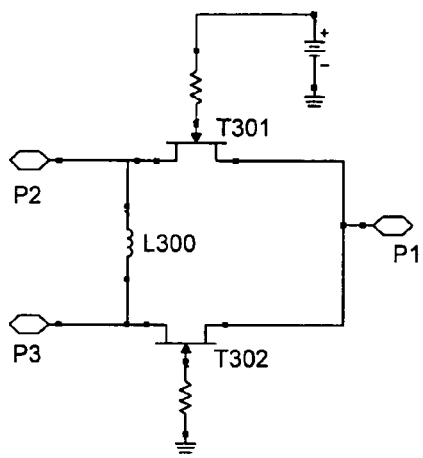
FIGS. 3A-3D show a first embodiment of an SPDT circuit, an equivalent circuit, a simulated transmission characteristic plot and a simulated isolation characteristic plot, respectively.

FIG. 3A shows a first embodiment of an SPDT circuit in accordance with one aspect of the invention. In this embodiment, an SPDT switch includes a first port P1; a second port P2; and a third port P3. The switching devices T301 and T302 have gate terminals that control signal flow across the source and drain terminals. In one embodiment, ports P2 and P3 correspond to the source terminals of the transistors T301 and T302, respectively, and port P1 coupled to the drain terminals of the transistors. In another embodiment, P2 and P3 correspond to the drain terminals of the transistors T301 and T302, respectively, and port P1 coupled to the source terminals of the transistors. An inductor L300 is connected between P2 and P3.

Figure 3B:
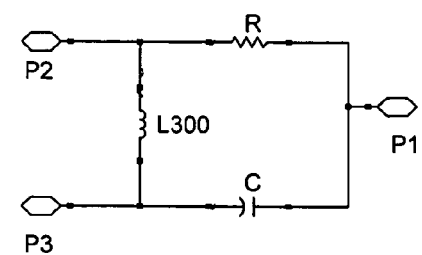

During operation, one of the transistors is ON, while the other is OFF. To illustrate, if transistor T301 is ON, a positive voltage is applied to the gate of T301, while a ground voltage is applied to the gate of T302 to turn T302 OFF. In such an example, FIG. 3B shows an equivalent circuit where the resistor R is in series with a capacitor C, with the inductor L300 in parallel.

Figure 3C:
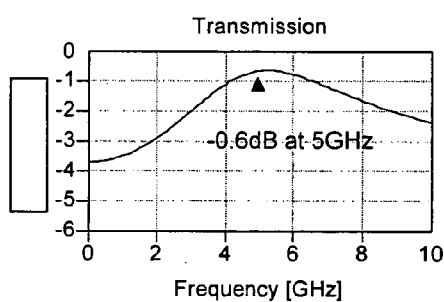
Figure 3D:
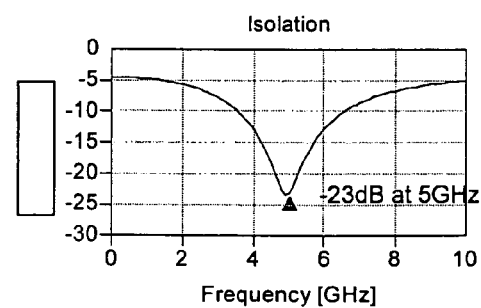

In a simulation with R=4 ohms, C=0.4 pF, and L300=2.4 nH, the transmission characteristic of FIG. 3A is charted in FIG. 3C, and the isolation characteristic of FIG. 3A is charted in FIG. 3D. The charts show that at 5 GHz, the insertion loss in transmission between P1 and P2 is at −0.6 dB, and the isolation between P1 and P3 is at −23 dB. In comparison to prior art as shown in FIG. 2A, prior art needs two inductors, one inductor for each transistor, while the invention in FIG. 3A needs only one inductor.

In one implementation, a single pole double throw (SPDT) switch includes a first port, a second port, a third port. A first transistor with its source terminal and the drain terminal is connected to the first port and the second port. Corresponding, a second transistor with its source terminal and the drain terminal is connected to the first port and the third port. An inductor is positioned across to the second and third ports. In an application as a transmit/receive (T/R) switch, the first port can be connected to an antenna, the second and third ports can be connected to the RF output of a transmitter and the RF input of a receiver. In an application for antenna diversity, the first port can be connected to either transmit or receive signal, while the second and third ports can be connected to a plurality of antennas.

Figure 4A:
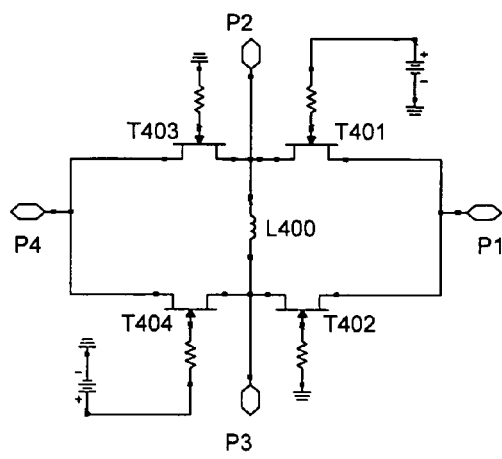
FIGS. 4A-4D show a second embodiment of a dual SPDT circuit, an equivalent circuit, a simulated transmission characteristic plot and a simulated isolation characteristic plot, respectively.

The inductor sharing can be expanded into multiple SPDT configurations for multiple bands. FIG. 4A shows a second embodiment for a set of two SPDT switches connected together, which is generally known as a DPDT switch. Each SPDT consists of two transistors with the same arrangement as shown in FIG. 3A. As shown in FIG. 4A, the first SPDT consists of T401 and T402, and the second SPDT consists of T403 and T404. The two SPDT switches are connected to each other at the P2 and P3 ports. An inductor L400 is connected between P2 and P3. As a comparison, the embodiment of invention as shown in FIG. 4A needs only one inductor while the prior art technique requires one inductor for each transistor or a total of four inductors.

Figure 4B:
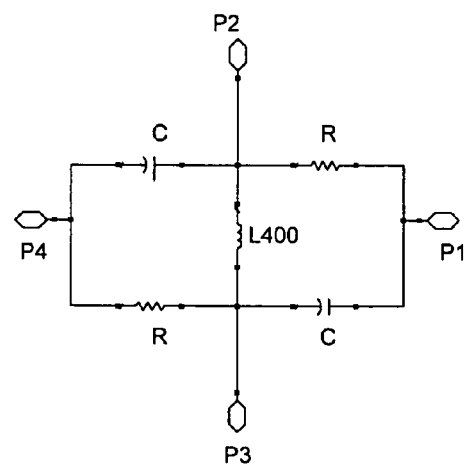

During a typical operation, one of the transistors T401-T402 is OFF, while the other is ON. Similarly, one of the transistors T403-T404 is OFF, while the other is ON. As shown FIG. 4A, T402 and T403 are turned OFF by applying a ground voltage to their gates, and T201 and T204 are turned ON by applying a positive voltage to their gates. In such an example, FIG. 4B shows an equivalent circuit for the DPDT switch. The equivalent circuit is two series RC connected in parallel with the inductor L400 connected between the RC junctions P2 and P3.

Figure 4C:
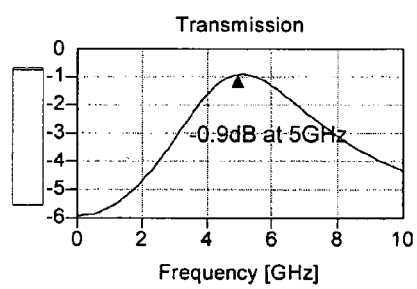
Figure 4D:
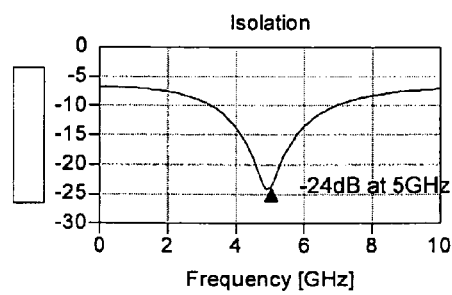

In a simulation with R=4 ohms, C=0.4 pF, and L=1.3 nH, the transmission characteristic of FIG. 4A is charted in FIG. 4C, and the isolation characteristic of FIG. 4A is charted in FIG. 4D. The simulated charts show that at 5 GHz, the insertion loss of transmission is at −0.9 dB, and the isolation is at −24 dB.

Figure 5A:
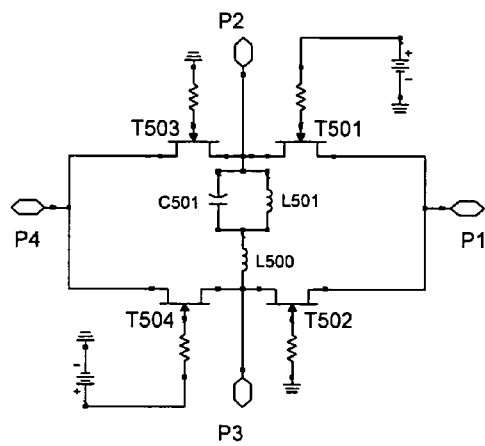
FIGS. 5A-5D show a third embodiment of a dual SPDT circuit for two frequency bands, an equivalent circuit, a simulated transmission characteristic plot and a simulated isolation characteristic plot, respectively.

FIG. 5A shows a third embodiment of a dual SPDT circuit optimized for two frequency bands, one at about 2.5 GHz and the other at about 5 GHz. FIG. 5A shows a second embodiment for a set of two SPDT switches connected together. Each one of the SPDT switches consists of two transistors with the same arrangement as illustrated in FIG. 3A. As shown in FIG. 5A, the first SPDT consists of T501 and T502, and the second SPDT consists of T503 and T504. P2 and P3 are connected by a frequency selecting circuit. The frequency selecting circuit consists of inductors L500 and L501 and a capacitor C501. C501 is connected in parallel with L501, and the C501-L501 parallel combination is connected in series with L500. Both C501 and L501 are coupled in series with the first inductor L500.

Figure 5B:
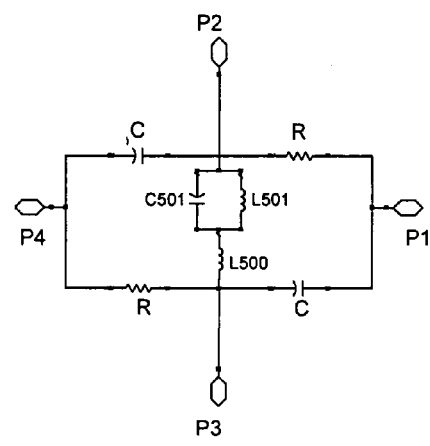

During operation, one of the transistors T501-T502 is OFF, while the other is ON. Similarly, one of the transistors T503-T504 is OFF, while the other is ON. As shown FIG. 5A, T502 and T503 are turned OFF by applying a ground voltage to their gates, and T501 and T504 are turned ON by applying a positive voltage to their gates. In such an example, FIG. 5B shows an equivalent circuit for the DPDT switch. The equivalent circuit is two series RC connected in parallel with the frequency selecting circuit connected to the RC junctions P2 and P3. The frequency selecting circuit consists of the inductor L500 connected to the RC junction P3 and the other end of the inductor L500 connected to a second capacitor C501 and a second inductor L501 in parallel. The other ends of the capacitor C501 and second inductor L501 are connected to the RC junction P2.

Figure 5C:
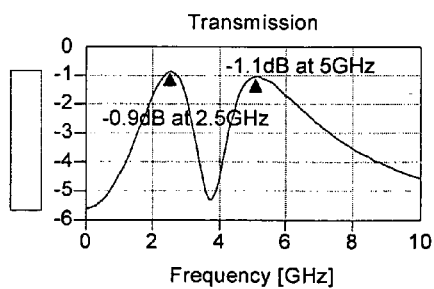
Figure 5D:
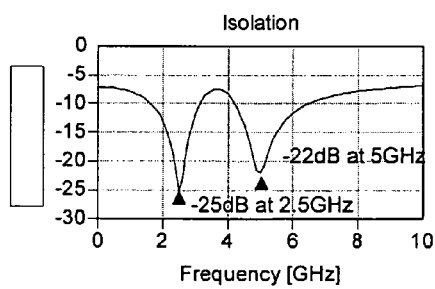

In a simulation with R=4 ohms, C=0.4 pF, C501=2.7 pF, L500=1.7 nH, and L501=1.1 nH, the simulated transmission characteristic of FIG. 5A is charted in FIG. 5C, and the isolation characteristic of FIG. 5A is charted in FIG. 5D. The simulated charts show that at 2.5 GHz, the insertion loss is at −0.9 dB, and the isolation is at −25 dB. Additionally, at 5 GHz, the insertion loss is at −1.1 dB, while the isolation is at −22 dB.

Figure 6:
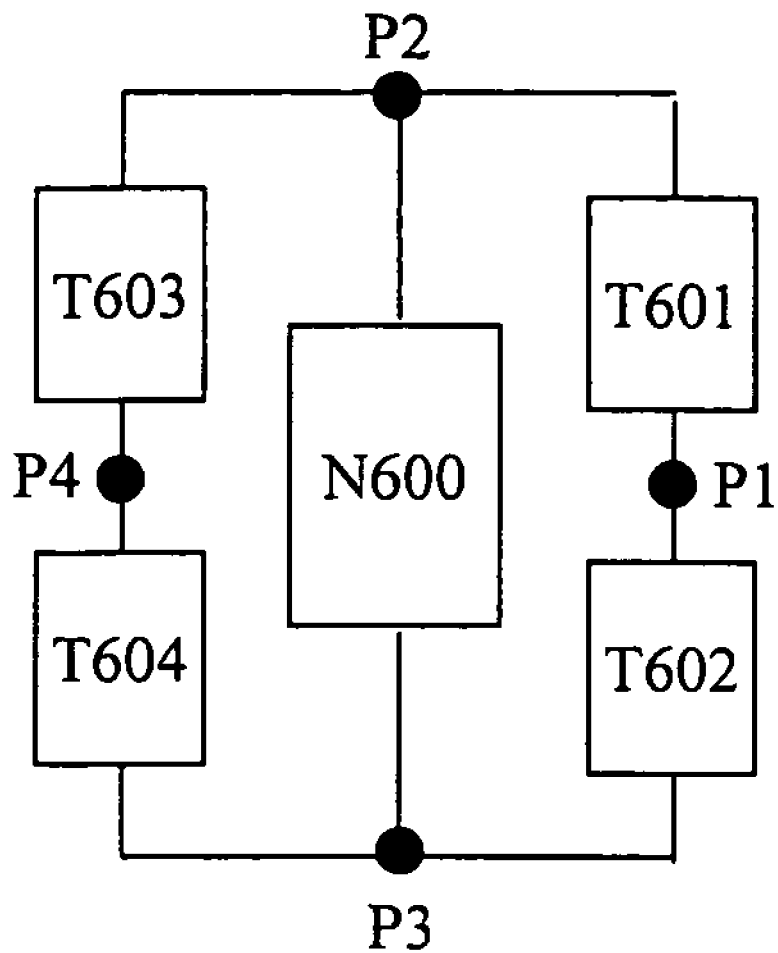
FIG. 6 shows a fourth embodiment of a circuit of multiple SPDT switches that shares one or more common devices.

FIG. 6 shows a fourth embodiment, where a multi-port circuit for switch radio frequency (RF) signals among one or more RF paths. It includes two sets of SPDT switches T601-T602 and T603-T604. Both SPDT switches share a common circuit network N600. The shared circuit can be a frequency selecting circuit, a matching network, a resonator, a filter, a micro-strip, or a transmission line, among others. The shared circuit can also be a resistor, a capacitor or an inductor, among others.

The embodiment of FIG. 6 switches RF signals by providing one or more SPDT switches coupled together at a plurality of ports and sharing a network between the ports. The count of the switches that share the network could also be a power of two, e.g., 4, 6, 8, or 16 SPDT switches sharing the same network.

As illustrated above, conventional switching circuits need inductors at each of the switching semiconductor devices. Such circuits need the large area for the inductors. In the present invention, by the sharing the inductors or the frequency selecting circuit, the total switch circuit can be miniaturized. Further, the switch circuit is not used only for the SPDT type, but also for DPDT type. The switch circuit can operate at multiple operation frequency bands (for example, 2.5 GHz and 5 GHz). Further, the invented switch circuit keeps high performances but uses only one inductor or frequency selecting circuit in the multi-port applications. The shared frequency selecting circuit can also other components for impedance matching, filtering, micro strips, resonators, transmission lines circuits, which are known to those who are familiar to the art of microwave circuits.

It is noted that the input and output port of a switch is symmetric and non-directional in general, and the external connection of P2 and P3 of FIG. 3A is not restricted to a first antenna and a second antenna. Using SPDT as an example, P2 and P3 can be connected to a pair of receiver and transmitter while P1 is connected to an antenna at the same time. Similarly, in the case of DPDT switch of FIG. 4A and FIG. 5A, P2 and P3 can be connected to a pair of receiver and transmitter, while P1 and P4 are connected to a first antenna and a second antenna, and vice versa.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A multi-port circuit to switch radio frequency (RF) signals among one or more RF signal paths, comprising
    a first RF switching device;
    a second RF switching device coupled to the first RF switching device;
    a third RF switching device coupled to the second RF switching device;
    a fourth RF switching device coupled to the third and first RF switching devices; and
    a shared circuit with one end coupled to the first and third RF switching devices, and the other end coupled to the second and fourth RF switch devices.

2. The circuit of claim 1, wherein each switching device is a transistor.

3. The circuit of claim 1, wherein the shared circuit comprises a frequency selecting circuit, a matching network, a resonator, a filter, a micro-strip, or a transmission line.

4. The circuit of claim 1, wherein the shared circuit comprises a resistor, a capacitor or an inductor.

5. A double pole double throw (DPDT) switch having first, second, third and fourth ports, comprising:
    a. first and second switching devices each having first and second terminals, wherein the first terminals are coupled to the first port and the second terminals are coupled to the second port and the third port, respectively;
    b. third and fourth switching devices each having third and fourth terminals, wherein the third terminals are coupled to the fourth port and the fourth terminals are coupled to the second port and third port, respectively; and
    c. a shared network positioned between the second and third ports.

6. The switch of claim 5, wherein the shared network comprises an inductor.

7. The switch of claim 6, further comprising a network circuit coupled in series with the inductor.

8. The switch of claim 7, wherein the network circuit comprises a capacitor coupled in parallel to a second inductor.

9. The switch of claim 5, comprising two or more transmitters, receivers or antennas coupled to the ports.

10. The switch of claim 5, wherein the shared network comprises a frequency selecting circuit, a matching network, a resonator, a filter, a micro-strip, or a transmission line.

11. The switch of claim 5, wherein the shared network comprises a resistor, a capacitor or an inductor.

12. The switch of claim 5, wherein the first and fourth ports are coupled to first and second radio frequency circuits and the second and third ports are coupled to first and second antennas.

13. The switch of claim 5, wherein the second and third ports are coupled to first and second radio frequency circuits, and the first and fourth ports are coupled to a plurality of antennas.

* * * * *